United States Patent
Ahn et al.

(10) Patent No.: US 8,836,059 B2
(45) Date of Patent: Sep. 16, 2014

(54) SHAPE ENHANCED PIN READ HEAD MAGNETIC TRANSDUCER WITH STRIPE HEIGHT DEFINED FIRST AND METHOD OF MAKING SAME

(71) Applicant: HGST Netherlands B.V., Amsterdam (NL)

(72) Inventors: Yongchul Ahn, San Jose, CA (US); Xiaozhong Dang, Fremont, CA (US); Yimin Hsu, Sunnyvale, CA (US); Quang Le, San Jose, CA (US); Thomas Leong, San Jose, CA (US); Simon Liao, Fremont, CA (US); Guangli Liu, Pleasanton, CA (US); Aron Pentek, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/724,662

(22) Filed: Dec. 21, 2012

(65) Prior Publication Data

US 2014/0175576 A1    Jun. 26, 2014

(51) Int. Cl.
  *H01L 29/82* (2006.01)
  *H01L 21/02* (2006.01)
(52) U.S. Cl.
  CPC .......... *H01L 21/02104* (2013.01); *H01L 29/82* (2013.01)

USPC ......... 257/421; 257/422; 438/48; 360/324.12

(58) Field of Classification Search
  USPC ............... 257/421, 422; 438/48; 360/324.12
  See application file for complete search history.

(56) References Cited

U.S. PATENT DOCUMENTS

| | | | |
|---|---|---|---|
| 5,729,410 A * | 3/1998 | Fontana et al. ............ 360/324.2 |
| 6,930,864 B2 | 8/2005 | Santini |
| 7,268,985 B2 | 9/2007 | Freitag et al. |
| 7,420,787 B2 | 9/2008 | Freitag et al. |
| 7,639,456 B2 | 12/2009 | Hong et al. |
| 7,770,284 B2 * | 8/2010 | Ohta et al. ................. 29/603.16 |
| 7,833,388 B2 | 11/2010 | Carey et al. |
| 7,911,745 B2 | 3/2011 | Antoku et al. |
| 8,081,403 B1 | 12/2011 | Chen et al. |
| 8,194,366 B1 | 6/2012 | Li et al. |
| 2007/0279801 A1 * | 12/2007 | Ohta et al. .................... 360/122 |
| 2008/0062584 A1 | 3/2008 | Freitag et al. |
| 2009/0021870 A1 | 1/2009 | Pinarbasi |
| 2013/0009630 A1 * | 1/2013 | Koike et al. ................... 324/200 |

* cited by examiner

*Primary Examiner* — Tu-Tu Ho
(74) *Attorney, Agent, or Firm* — Patterson & Sheridan, LLP (57) ABSTRACT

The present invention generally relates to a magnetic sensor in a read head having a hard or soft bias layer that is uniform in thickness within the sensor stack. The method of making such sensor is also disclosed. The free layer stripe height is first defined, followed by defining the track width, and lastly the pinned layer stripe height is defined. The pinned layer and the hard or soft bias layer are defined in the same process step. This approach eliminates a partial hard or soft bias layer and reduces potential instability issues.

6 Claims, 8 Drawing Sheets

SHAPE ENHANCED PIN READ HEAD MAGNETIC TRANSDUCER WITH STRIPE HEIGHT DEFINED FIRST AND METHOD OF MAKING SAME

BACKGROUND OF THE INVENTION

1. Field of the Invention

Embodiments of the present invention generally relate to a magnetic read head for use in a hard disk drive (HDD).

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards contact with the surface of the disk when the disk is not rotating but, when the disk rotates, air is swirled by the rotating disk adjacent an air bearing surface (ABS) of the slider causing the slider to ride on an air a slight distance from the surface of the rotating disk. When the slider rides on the air, the write and read heads are employed for writing magnetic impressions to, and reading magnetic signal fields from, the rotating disk. The read and write heads are connected to processing circuitry that operates according to a computer program to implement the writing and reading functions.

In a read head, a giant magnetoresistive (GMR) sensor, or a tunnel junction magnetoresistive (TMR) sensor has been utilized for sensing magnetic fields from the rotating disk. A typical GMR sensor includes a non-magnetic layer barrier such as MgO or spacer such as AgSn sandwiched between a pinned layer and a free layer, while a typical TMR sensor includes a thin non-magnetic, electrically insulating barrier layer sandwiched between a pinned layer and a free layer. Magnetic shields are positioned above and below the sensor stack and can also serve as first and second electrical leads so that the electrical current travels perpendicularly to the plane of the free layer, spacer layer and pinned layer. This configuration is known as the current perpendicular to the plane (CPP) mode of operation. The magnetization of the pinned layer is pinned perpendicular to the ABS and the magnetic moment of the free layer is located parallel to the ABS, but free to rotate in response to external magnetic fields. The magnetization of the pinned layer is typically pinned by exchange coupling with an antiferromagnetic layer such as IrMn.

The scaling of read head dimensions to achieve higher areal density has pushed the pinned layer stripe height so short that the edge degradation and thermal stability of the pinned layer start to cause magnetic head performance and reliability issues. One approach to improve the read head stability is to extend the pinned layer from the backedge of the free layer stripe height. This approach is known as the shape enhanced pinned layer (SEP). The method of forming the SEP structure is important to reduce potential instability issues. Thus there is a need for an improved method of forming a SEP structure and an improved SEP structure design.

SUMMARY OF THE INVENTION

The present invention generally relates to a magnetic sensor in a read head having a hard or soft bias layer that is uniform in thickness within the sensor stack. The method of making such sensor is also disclosed. The free layer stripe height is first defined, followed by defining the track width, and lastly the pinned layer stripe height is defined. The pinned layer and the hard or soft bias layer are defined in the same process step. This approach eliminates a partial hard or soft bias layer and reduces potential instability issues.

In one embodiment, a magnetic head comprises a sensor stack formed over a substrate. The sensor stack has a pinned layer, a free layer and a non-magnetic layer sandwiched between the pinned layer and the free layer. The sensor stack has first and second laterally opposed sides, and the sensor stack has a first channel and a second channel formed therein to expose the substrate. The first channel is bound by the first laterally opposed side and a dielectric material, and the second channel is bound by the second laterally opposed side and the dielectric material. A first hard or soft bias layer is formed within the first channel over the substrate, and the first hard or soft bias layer has a substantially uniform thickness within the first channel. A second hard or soft bias layer is formed within the second channel over the substrate, wherein the second hard or soft bias layer has a substantially uniform thickness within the second channel.

In another embodiment, a method of forming a magnetic head comprises forming a sensor stack over a substrate. The sensor stack has at least a pinned layer, a non-magnetic layer disposed on the pinned layer, and a free layer disposed on the non-magnetic layer. The method further comprises removing a first portion of the sensor stack to expose the pinned layer and depositing a first dielectric layer. The first dielectric layer comprises one or more dielectric materials. The method also comprises removing a second portion of the sensor stack to expose the substrate and form one or more channels, depositing a barrier layer in the one or more channels, depositing a hard or soft bias layer over the barrier layer within the one or more channels, removing a third portion of the sensor stack to expose the substrate, and depositing a second dielectric layer. The second dielectric layer comprises one or more dielectric materials and the hard or soft bias layer has a substantially uniform thickness within the one or more channels.

In another embodiment, a method of forming a magnetic head comprises forming a sensor stack over a substrate. The sensor stack has at least a pinned layer, a non-magnetic layer disposed on the pinned layer, and a free layer disposed on the non-magnetic layer. The method further comprises forming one or more channels within the sensor stack and filling the one or more channels with a hard or soft bias material. The hard or soft bias material has a substantially uniform thickness within the one or more channels. The method further comprises defining the pinned layer stripe height and the hard or soft bias layer at the same process step.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present invention generally relates to a magnetic sensor in a read head having a hard or soft bias layer that is uniform in thickness within the sensor stack. The method of making such sensor is also disclosed. The free layer stripe height is first defined, followed by defining the track width, and lastly the pinned layer stripe height is defined. The pinned layer and the hard or soft bias layer are defined in the same process step. This approach eliminates a partial hard or soft bias layer and reduces potential instability issues.

Figure 1:
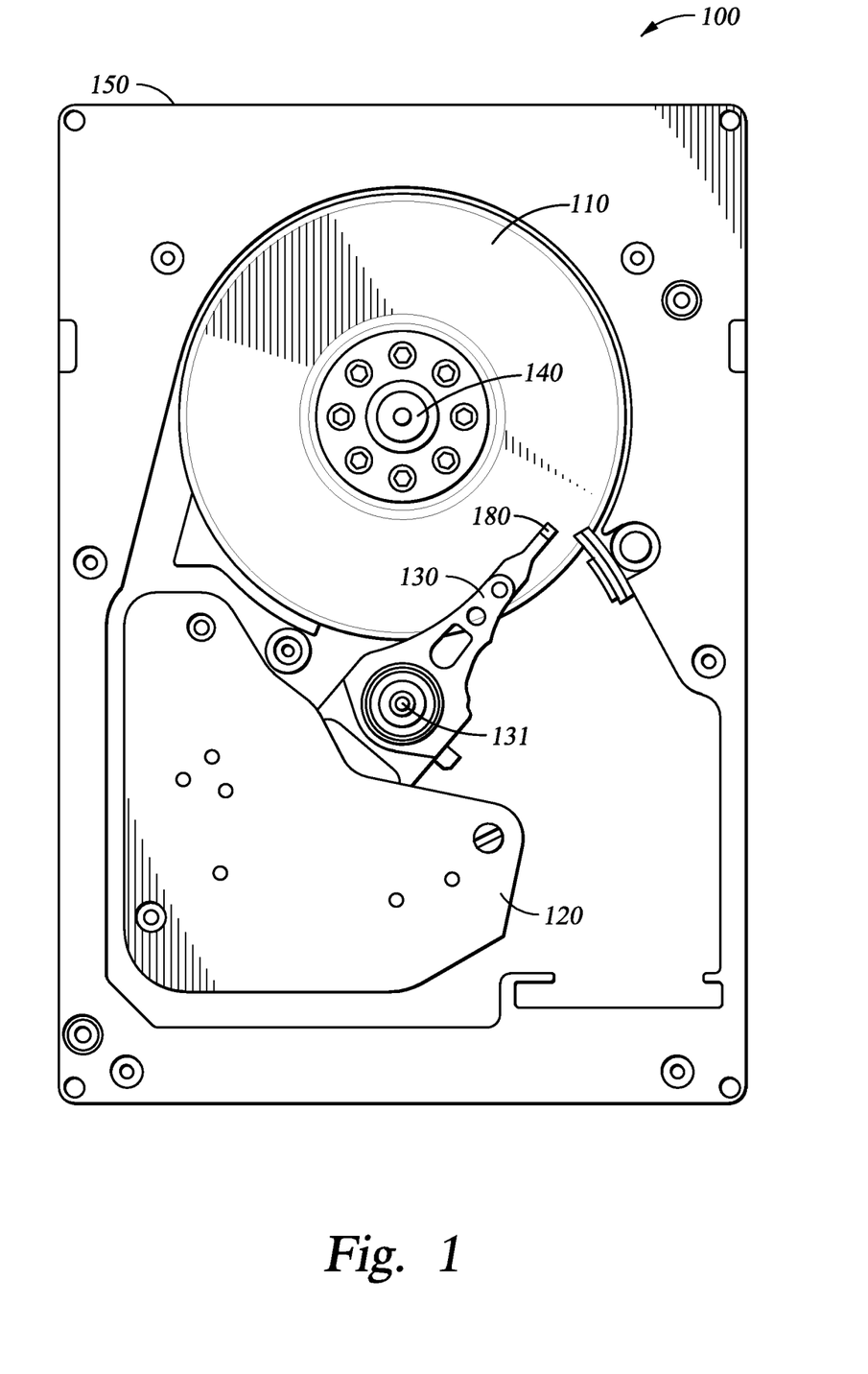
FIG. 1 illustrates an exemplary magnetic disk drive, according to an embodiment of the invention.

FIG. 1 illustrates a top view of an exemplary HDD 100, according to an embodiment of the invention. As illustrated, HDD 100 may include one or more magnetic disks 110, actuator 120, actuator arms 130 associated with each of the magnetic disks, and spindle motor 140 affixed in a chassis 150. The one or more magnetic disks 110 may be arranged vertically as illustrated in FIG. 1. Moreover, the one or more magnetic disks may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

Figures 2A, 2B:
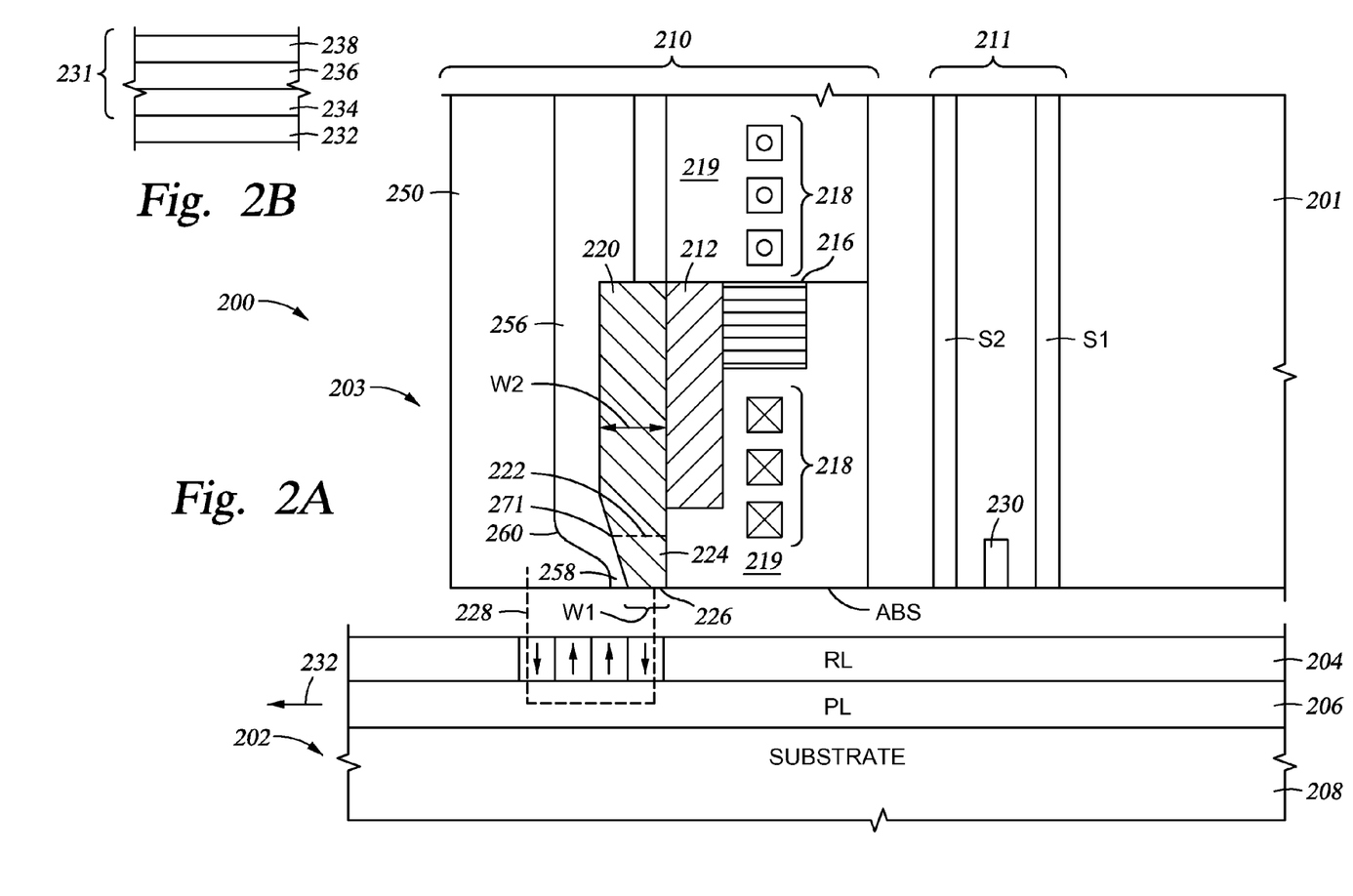
FIG. 2A is a cross sectional view of a read/write head and a magnetic disk of the disk drive of FIG. 1, according to one embodiment of the invention.
FIG. 2B is a schematic cross sectional view of portions of the magnetic head before patterning.

FIG. 2A is a fragmented, cross sectional side view through the center of a read/write head 200 mounted on a slider 201 and facing a magnetic disk 202. The read/write head 200 and magnetic disk 202 may correspond to the magnetic head 180 and magnetic disk 110, respectively in FIG. 1. In some embodiments, the magnetic disk 202 may be a "dual-layer" medium that includes a perpendicular magnetic data recording layer (RL) 204 on a "soft" or relatively low-coercivity magnetically permeable underlayer (PL) 206 formed on a disk substrate 208. The read/write head 200 includes an ABS, a magnetic write head 210 and a magnetic read head 211, and is mounted such that its ABS is facing the magnetic disk 202. In FIG. 2A, the disk 202 moves past the write head 210 in the direction indicated by the arrow 232, so the portion of slider 201 that supports the read/write head 200 is often called the slider "trailing" end 203.

The write head 210 includes a magnetic circuit made up of a main pole 212 and a yoke 216. The write head 210 also includes a thin film coil 218 shown in the section embedded in non-magnetic material 219 and wrapped around yoke 216. In an alternative embodiment, the yoke 216 may be omitted, and the coil 218 may wrap around the main pole 212. A write pole 220 is magnetically connected to the main pole 212 and has an end 226 that defines part of the ABS of the magnetic write head 210 facing the outer surface of disk 202.

Write pole 220 is a flared write pole and includes a flare point 222 and a pole tip 224 that includes an end 226 that defines part of the ABS. The flare may extend the entire height of write pole 220 (i.e., from the end 226 of the write pole 220 to the top of the write pole 220), or may only extend from the flare point 222, as shown in FIG. 2A. In one embodiment the distance between the flare point 222 and the ABS is between about 30 nm and about 150 nm.

The write pole 220 includes a tapered surface 271 which increases a width of the write pole 220 from a first width W1 at the ABS to a second width W2 away from the ABS. In one embodiment, the width W1 may be between around 60 nm and 200 nm, and the width W2 may be between around 120 nm and 350 nm. While the tapered region 271 is shown with a single straight surface in FIG. 2A, in alternative embodiment, the tapered region 271 may include a plurality of tapered surfaces with different taper angles with respect to the ABS.

The tapering improves magnetic performance. For example, reducing the width W1 at the ABS may concentrate a magnetic field generated by the write pole 220 over desirable portions of the magnetic disk 202. In other words, reducing the width W1 of the write pole 220 at the ABS reduces the probability that tracks adjacent to a desirable track are erroneously altered during writing operations.

While a small width of the write pole 220 is desired at the ABS, it may be desirable to have a greater width of the write pole 220 in areas away from the ABS. A larger width W2 of the write pole 220 away from the ABS may desirably increase the magnetic flux to the write pole 220, by providing a greater thickness of the write pole 220 in a direction generally parallel to the ABS. In operation, write current passes through coil 218 and induces a magnetic field (shown by dashed line 228) from the write pole 220 that passes through the RL 204 (to magnetize the region of the RL 204 beneath the write pole 220), through the flux return path provided by the PL 206, and back to an upper return pole 250. In one embodiment, the greater the magnetic flux of the write pole 220, the greater is the probability of accurately writing to desirable regions of the RL 204.

FIG. 2A further illustrates one embodiment of the upper return pole or magnetic shield 250 that is separated from write pole 220 by a nonmagnetic gap layer 256. In some embodiments, the magnetic shield 250 may be a trailing shield wherein substantially all of the shield material is on the trailing end 203. Alternatively, in some embodiments, the magnetic shield 250 may be a wrap-around shield wherein the shield covers the trailing end 203 and also wraps around the sides of the write pole 220. As FIG. 2A is a cross section through the center of the read/write head 200, it represents both trailing and wrap-around embodiments.

Near the ABS, the nonmagnetic gap layer 256 has a reduced thickness and forms a shield gap throat 258. The throat gap width is generally defined as the distance between the write pole 220 and the magnetic shield 250 at the ABS. The shield 250 is formed of magnetically permeable material (such as Ni, Co and Fe alloys) and gap layer 256 is formed of nonmagnetic material (such as Ta, TaO, Ru, Rh, NiCr, SiC or $Al_2O_3$). A taper 260 in the gap material provides a gradual transition from the throat gap width at the ABS to a maximum gap width above the taper 260. This gradual transition in width forms a tapered bump in the non-magnetic gap layer that allows for greater magnetic flux density from the write pole 220, while avoiding saturation of the shield 250.

It should be understood that the taper 260 may extend either more or less than is shown in FIG. 2A. The taper may extend upwards to an end of shield 250 opposite the ABS (not shown), such that the maximum gap width is at the end of the shield opposite the ABS. The gap layer thickness increases from a first thickness (the throat gap width) at the ABS to greater thicknesses at a first distance from the ABS, to a greatest thickness at a second distance (greater than the first distance) from the ABS.

In some embodiments, the magnetic read head 211 is a GMR sensor read head that includes a GMR sensing element 230 located between magnetoresistive (MR) shields S1 and S2. In other embodiments, the magnetic read head 211 is a magnetic tunnel junction (MTJ) that utilizes a TMR sensor. The MTJ read head includes a sensing device 230 located between MR shields S1 and S2. The RL 204 is illustrated with perpendicularly recorded or magnetized regions, with adjacent regions having magnetization directions, as represented by the arrows located in the RL 204. The magnetic fields of the adjacent magnetized regions are detectable by the GMR (or MTJ) sensing device 230 as the recorded bits.

FIG. 2B is a schematic cross sectional view of portions of the magnetic head before patterning. The GMR sensing element 230 in FIG. 2A includes a sensor stack 231 formed over a substrate 232. The substrate 232 may be a wafer or a glass substrate. In some embodiments, the sensor stack 231 may be deposited on layers that have already been deposited on the substrate 232. The layers already deposited on the substrate layer 232 may be a seed layer, a shield layer, or a combination thereof. The sensor stack 231 comprises a pinned layer 234, a free layer 238, and a non-magnetic layer 236 sandwiched between the pinned layer 234 and the free layer 238.

The pinned layer 234 may be one of several types of pinned layers, such as a simple pinned, antiparallel pinned, self pinned or antiferromagnetic pinned sensor. The non-magnetic layer 236 may comprise an insulating material such as MgO or alumina. For CPP mode of operation, the non-magnetic layer 236 may be a spacer such as AgSn. The free layer 238 may comprise ferromagnetic material such as Co, CoFe, CoFeB, NiFe or combinations thereof. Over the free layer 238 there may be an optional capping layer (not shown in FIG. 2B). The capping layer may comprise a material to protect the sensor from damage such as ruthenium, tantalum, or any combination thereof.

Figure 3A:
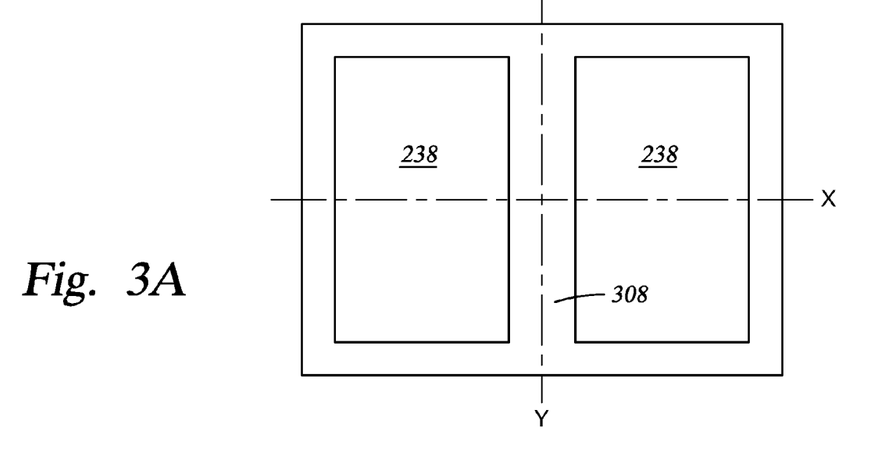
FIGS. 3A-3D illustrate the process of defining the track width.

The next process steps are to pattern the sensor stack 231. There are different approaches in patterning the sensor stack 231. FIGS. 3A-3D, 4A-4D, and 5A-5D illustrate one approach. FIGS. 3A-3D depict the process of defining the track width. FIG. 3A is a top view showing a mask 308 placed on top of the free layer 238 covering portions of sensor stack 231. Portions of sensor stack 231 not covered by the mask 308 will be removed, and the void will be filled with one or more materials.

The mask 308 may be deposited and patterned by methods that are known in the art. In one embodiment, a mask layer is deposited on the free layer 238 by spin coating and patterned by photolithography. Photolithography is done by aligning a pre-patterned photomask on the mask layer and irradiating the mask layer with ultraviolet light. The pattern of the photomask is then transferred to the mask layer by removing the irradiated portions and thus, forming the mask 308. Next, portions of the sensor stack 231 not covered by the mask 308 will be removed. Any method known in the art may be used to remove the portions. In one embodiment, the portions are removed by reactive ion etching, followed by ion milling. The mask 308 is then removed by any method known in the art. As the result of the reactive ion etching and ion milling, one or more channels are formed to expose the substrate 232.

The one or more channels are to be filled with one or more materials. The one or more channels may be first coated with a barrier layer 303 made of insulating material such as silicon nitride (SiN), TaOx, AlOx, or SiOxNy. In one embodiment, the barrier layer 303 comprises SiN. The channels are then to be filled with a hard or soft bias layer 304. The hard or soft bias layer 304 typically comprises a nonmagnetic seed layer such as chromium (Cr) and a hard-magnetic biasing layer such as CoFe, CoPt, FePt, or CoPtCr for hard bias or a soft-magnetic biasing layer such as NiFe, CoFe, NiFeMo, alloys of these compounds, or any combination thereof for soft bias. In one embodiment, the hard bias layer 304 comprises a Cr seed layer, a CoPt hard magnet, and a capping layer. The barrier layer 303 and the hard or soft bias layer 304 may be deposited by any method known in the art, such as atomic layer deposition (ALD), chemical vapor deposition (CVD), or physical vapor deposition (PVD). In one embodiment, the barrier layer 303 is deposited by CVD and the hard or soft bias layer 304 is deposited by PVD. Following the deposition of the hard or soft bias layer 304, the top of the sensor stack 231 may be planarized for further deposition. In one embodiment, a chemical mechanical polishing is used to planarize the top of the sensor stack 231.

Figure 3B:
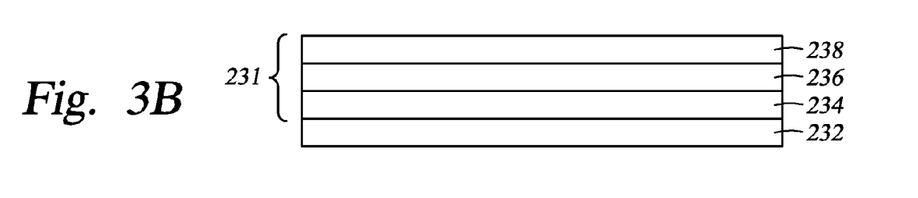
Figure 3C:
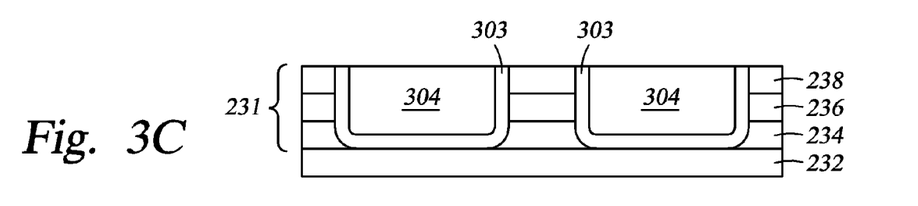
Figure 3D:
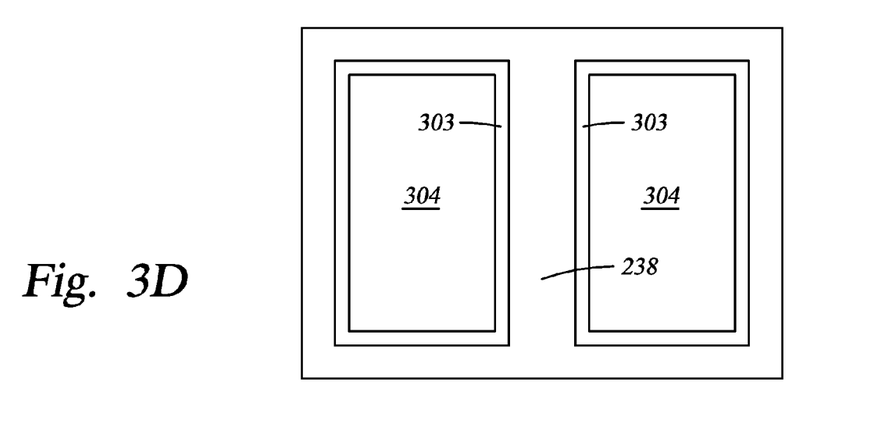

FIGS. 3B, 3C, and 3D depict the resulting structure. FIG. 3B is a cross sectional view of the sensor stack 231 along line y shown in FIG. 3A. Because the cross section along line y is protected by the mask 308, the layers in FIG. 3B are the same as in FIG. 2B. FIG. 3C is a cross sectional view of the sensor stack along line x shown in FIG. 3A. Portions of the pinned layer 234, the non-magnetic layer 236, and the free layer 238 not covered by the mask 308 have been removed. The barrier layer 303 is then deposited in the one or more channels formed as the result of the removal. The hard or soft bias layer 304 is then deposited in the channels. FIG. 3D is a top view of the resulting structure. Portions of the free layer 238 are protected by the mask 308. The unprotected portions have been replaced with the barrier layer 303 and the hard or soft bias layer 304.

Figure 4A:
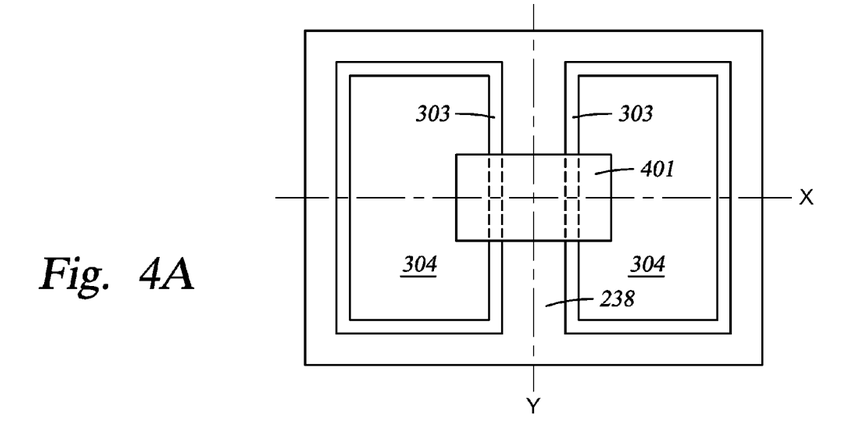
FIGS. 4A-4D illustrate the process of defining the free layer stripe height.

Following the definition of the track width, the free layer is patterned. FIGS. 4A-4D illustrate the process of defining the free layer stripe height. FIG. 4A is a top view showing a mask 401 placed on the newly formed top of the sensor stack 231. The portion of the sensor stack 231 covered by the mask 401 is illustrated with dotted lines. Portions of the sensor stack 231 not protected by the mask 401 will be removed, and the void formed will be filled with one or more materials.

The mask 401 may be deposited and patterned by methods that are known in the art. In one embodiment, a mask layer is deposited on the sensor stack 231 by spin coating and patterned by photolithography. Photolithography is done by aligning a pre-patterned photomask on the mask layer and irradiating the mask layer with ultraviolet light. The pattern of the photomask is then transferred to the mask layer by removing the irradiated portions and thus, forming the mask 401. Next, portions of the sensor stack not covered by the mask 401 will be removed. Any method known in the art may be used to remove the portions. In one embodiment, the portions are removed by reactive ion etching, followed by ion milling. The mask 401 is then removed by any method known in the art. As the result of the reactive ion etching and ion milling, portions of the pinned layer 234 are exposed.

The exposed portions of the pinned layer 234 are to be covered with a dielectric layer 403. The dielectric layer 403 may comprise one or more materials such as $AlO_x$, $TaO_x$, $SiN_x$, $MgO_x$, or any combination thereof. The materials are chosen to realize a flat surface after the patterning of the free layer 238. The deposition of the dielectric layer 403 may be achieved by ALD, CVD, or PVD. In one embodiment, the dielectric layer 403 comprises AlO and is deposited by ALD. Following the deposition of the dielectric layer 403, the top of the sensor stack 231 may be planarized for further deposition. In one embodiment, a chemical mechanical polishing is used to planarize the top of the sensor stack 231.

Figure 4B:
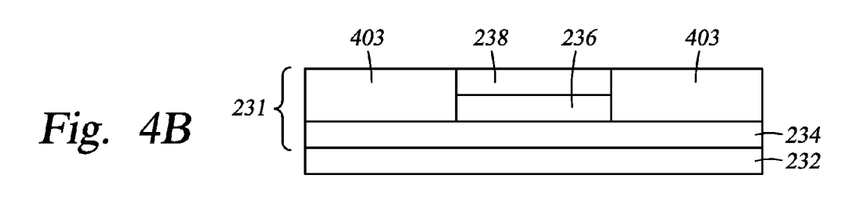
Figure 4C:
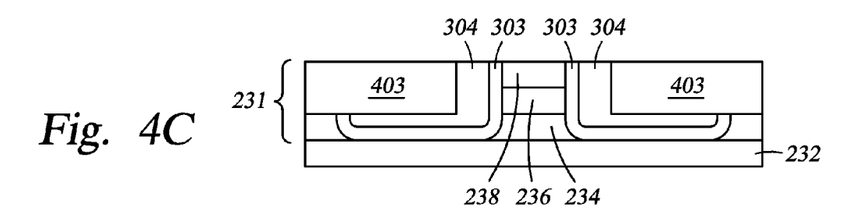
Figure 4D:
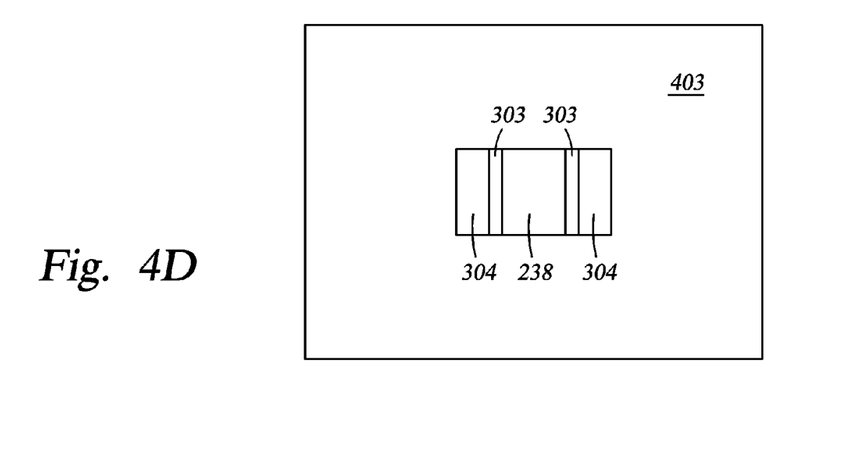

FIGS. 4B, 4C, and 4D depict the resulting structure. FIG. 4B is a cross sectional view of the sensor stack 231 along line y shown in FIG. 4A. Along line y, portions of the free layer 238 and the non-magnetic layer 236 not covered by the mask 401 have been removed and replaced with the dielectric layer 403. FIG. 4C is a cross sectional view of the sensor stack along line x shown in FIG. 4A. Along line x, portions of the non-magnetic layer 236, the free layer 238, the barrier layer 303, and the hard or soft bias layer 304 not covered by the mask 401 have been removed and replaced by the dielectric layer 403. FIG. 4D is a top view of the resulting structure. Portions not protected by the mask 401 have been removed and replaced with the dielectric layer 403. Portions of the hard or soft bias layer 304, the barrier layer 303, and the free layer 238 protected by the mask 401 remain on top of the sensor stack.

Figure 5A:
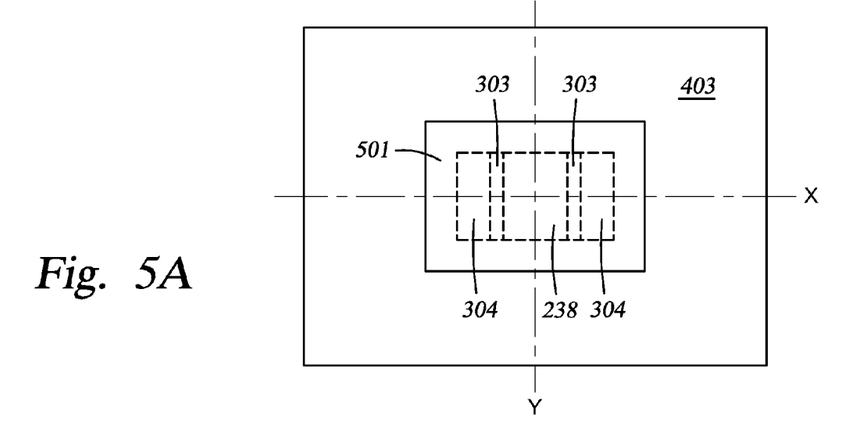
FIGS. 5A-5D illustrate the process of defining the pinned layer stripe height.

FIGS. 5A-5D illustrate the process of defining the pinned layer stripe height. FIG. 5A is a top view showing a mask 501 placed on the newly formed top of the sensor stack 231. The portion of the sensor stack 231 covered by the mask 501 is illustrated with dotted lines. Portions of the sensor stack 231 not protected by the mask 501 will be removed, and the void formed will be filled with one or more materials.

The mask 501 may be deposited and patterned by methods that are known in the art. In one embodiment, a mask layer is deposited on the sensor stack 231 by spin coating and patterned by photolithography. Photolithography is done by aligning a pre-patterned photomask on the mask layer and irradiating the mask layer with ultraviolet light. The pattern of the photomask is then transferred to the mask layer by removing the irradiated portions and thus, forming the mask 501. Next, portions of the sensor stack not covered by the mask 501 will be removed. Any method known in the art may be used to remove the portions. In one embodiment, the portions are removed by reactive ion etching, followed by ion milling. The mask 501 is then removed by any method known in the art. As the result of the reactive ion etching and ion milling, portions of the substrate 232 are exposed.

The exposed portions of the substrate 232 are to be covered with a second dielectric layer 503. The second dielectric layer 503 may or may not be the same material as the dielectric layer 403. The second dielectric layer 503 may comprise one or more materials such as $AlO_x$, $TaO_x$, $SiN_x$, $MgO_x$, or any combination thereof. Again the materials are chosen to realize a flat surface after the defining of the pinned layer stripe height. The deposition of the second dielectric layer 503 may be achieved by ALD, CVD, or PVD. In one embodiment, the dielectric layer 503 comprises MgO and is deposited by ALD. Following the deposition of the second dielectric layer 503, the top of the sensor stack 231 may be planarized for further deposition. In one embodiment, a chemical mechanical polishing is used to planarize the top of the sensor stack 231.

Figure 5B:
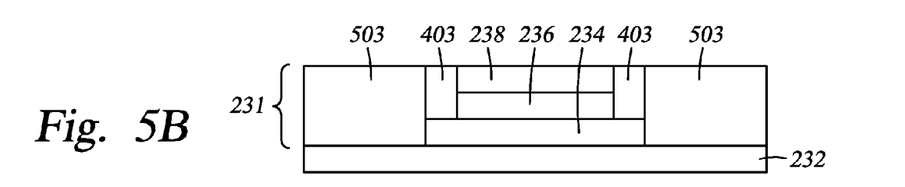
Figure 5C:
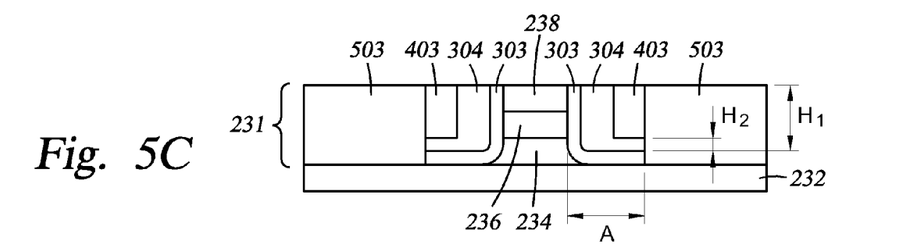
Figure 5D:
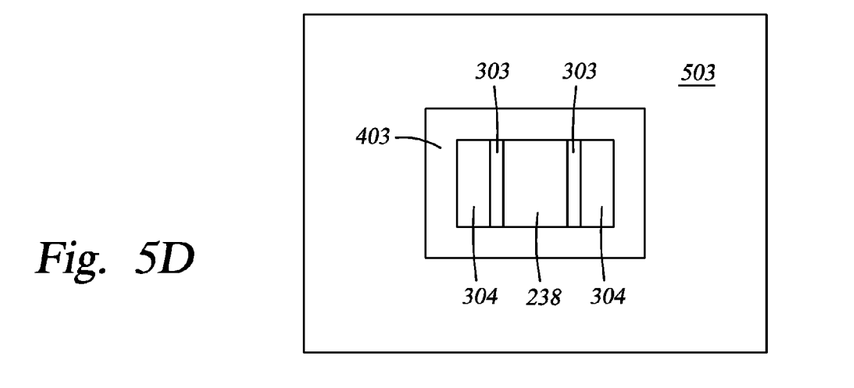

FIGS. 5B, 5C, and 5D depict the resulting structure. FIG. 5B is a cross sectional view of the sensor stack 231 along line y shown in FIG. 5A. Along line y, portions of the dielectric layer 403 and the pinned layer 234 not covered by the mask 501 have been removed and replaced with the second dielectric layer 503. FIG. 5C is a cross sectional view of the sensor stack along line x shown in FIG. 5A. Along line x, portions of the pinned layer 234, the dielectric layer 403, the barrier layer 303, and the hard or soft bias layer 304 not covered by the mask 501 have been removed and replaced by the second dielectric layer 503. The hard or soft bias layer 304 has a width within the channels, represented by arrows "A". Along the width "A", the hard or soft bias layer 304 has uneven thickness within the channels, represented by arrows "H1" and "H2".

FIG. 5D is a top view of the resulting structure. Portions not protected by the mask 501 have been removed and replaced with the second dielectric layer 503. Portions of the dielectric layer 403, the hard or soft bias layer 304, the barrier layer 303, and the free layer 238 protected by the mask 501 remain on top of the sensor stack.

FIGS. 3A-3D, 4A-4D, and 5A-5D illustrate one approach of forming a SEP structure. Such structure has one or more channels partially filled with a hard or soft bias layer. The hard or soft bias layer may have an uneven thickness within the channels. One embodiment of the invention is to form a SEP structure with one or more channels fully filled with a hard or soft bias layer, and the hard or soft bias layer has a substantially uniform thickness within the sensor stack to thereby enhance stability. FIGS. 6A-6D, 7A-7D, and 8A-8D illustrate the process steps of forming such SEP structure.

These process steps also start with the structure shown in FIG. 2B, where a sensor stack 231 is formed over a substrate 232. Instead of defining the track width first, this approach, according to one embodiment, defines the free layer stripe height first, then the track width, and lastly the pinned layer stripe height.

Figure 6A:
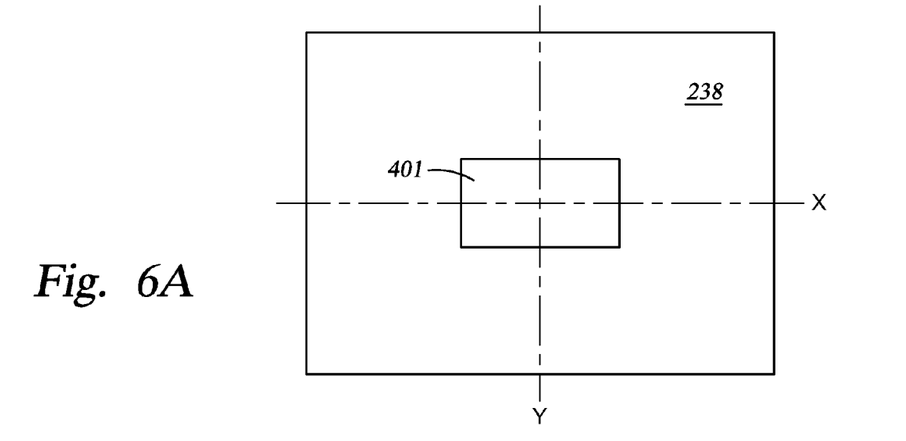
FIGS. 6A-6D illustrate the process of defining the free layer stripe height according to various embodiments of the invention.

FIGS. 6A-6D illustrate the process steps of defining the free layer stripe height. FIG. 6A is a top view showing a mask 401 placed on top of the free layer 238 covering a portion of the sensor stack 231. Portions of the sensor stack 231 not protected by the mask 401 will be removed, and the void formed will be filled with one or more materials.

The mask 401 may be deposited and patterned by methods that are known in the art. In one embodiment, a mask layer is deposited on the free layer 238 by spin coating and patterned by photolithography. Photolithography is done by aligning a pre-patterned photomask on the mask layer and irradiating the mask layer with ultraviolet light. The pattern of the photomask is then transferred to the mask layer by removing the irradiated portions and thus, forming the mask 401. Next, portions of the sensor stack not covered by the mask 401 will be removed. Any method known in the art may be used to remove the portions. In one embodiment, the portions are removed by reactive ion etching, followed by ion milling. The mask 401 is then removed by any method known in the art. As the result of the reactive ion etching and ion milling, portions of the pinned layer 234 are exposed.

The exposed portions of the pinned layer 234 are to be covered with a dielectric layer 403. The dielectric layer 403 may comprise one or more materials such as $AlO_x$, $TaO_x$, $SiN_x$, $MgO_x$, or any combination thereof. The materials are chosen to realize a flat surface after the patterning of the free layer 238. The deposition of the dielectric layer 403 may be achieved by ALD, CVD, or PVD. In one embodiment, the dielectric layer 403 comprises AlO and is deposited by ALD. Following the deposition of the dielectric layer 403, the top of the sensor stack 231 may be planarized for further deposition. In one embodiment, a chemical mechanical polishing is used to planarize the top of the sensor stack 231.

Figure 6B:
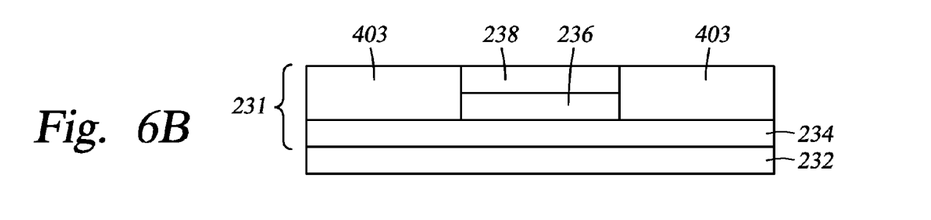
Figure 6C:
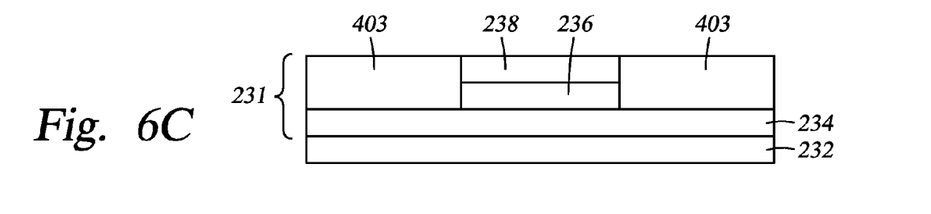
Figure 6D:
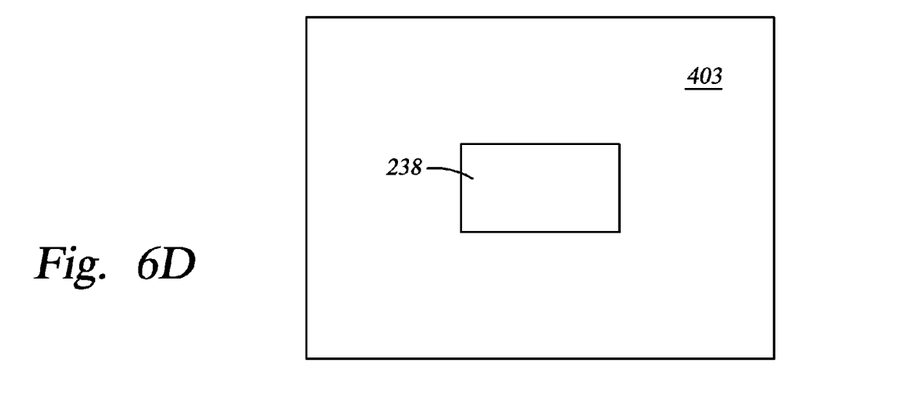

FIGS. 6B, 6C, and 6D depict the resulting structure. FIG. 6B is a cross sectional view of the sensor stack 231 along line y shown in FIG. 6A. Along line y, portions of the free layer 238 and the non-magnetic layer 236 not covered by the mask 401 have been removed and replaced with the dielectric layer 403. FIG. 6C is a cross sectional view of the sensor stack along line x shown in FIG. 6A. Along line x, portions of the free layer 238 and the non-magnetic layer 236 not covered by the mask 401 have been removed and replaced with the dielectric layer 403. FIG. 4D is a top view of the resulting structure. Portions not protected by the mask 401 have been removed and replaced with the dielectric layer 403. Portions of the free layer 238 protected by the mask 401 remain on top of the sensor stack.

Figure 7A:
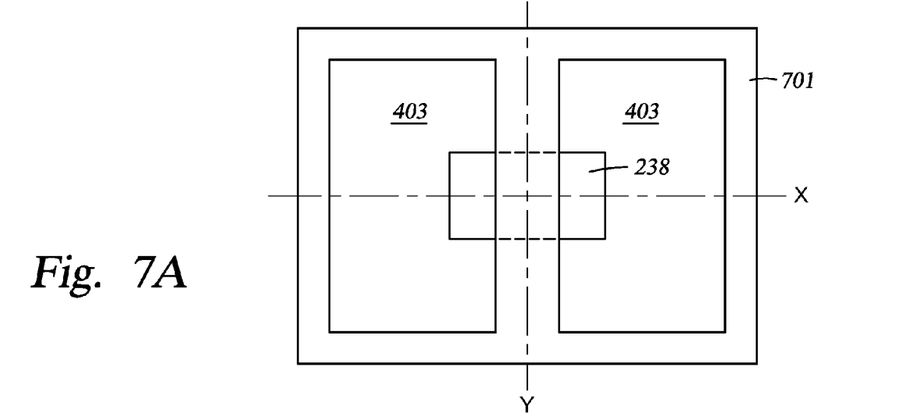
FIG. 7A-7D illustrate the process of defining the track width according to various embodiments of the invention.

Following the patterning of the free layer, i.e., defining the free layer stripe height, the track width is defined. FIGS. 7A-7D illustrate the process steps of defining the track width. FIG. 7A is a top view showing a mask 701 placed on the newly formed top of the sensor stack 231. The portion of the sensor stack 231 covered by the mask 701 is illustrated with dotted lines. Portions of the sensor stack 231 not protected by the mask 701 will be removed, and the void formed will be filled with one or more materials.

The mask 701 may be deposited and patterned by methods that are known in the art. In one embodiment, a mask layer is deposited on the sensor stack 231 by spin coating and patterned by photolithography. Photolithography is done by aligning a pre-patterned photomask on the mask layer and irradiating the mask layer with ultraviolent light. The pattern of the photomask is then transferred to the mask layer by removing the irradiated portions and thus, forming the mask 701. Next, portions of the sensor stack 231 not covered by the mask 701 will be removed. Any method known in the art may be used to remove the portions. In one embodiment, the portions are removed by reactive ion etching, followed by ion milling. The mask 701 is then removed by any method known in the art. As the result of the reactive ion etching and ion milling, one or more channels are formed to expose the substrate 232.

The one or more channels are to be filled with one or more materials. The one or more channels may be first coated with a barrier layer 303 made of insulating material such as SiN, TaOx, AlOx, or SiOxNy. In one embodiment, the barrier layer 303 comprises SiN. The channels are then to be filled with a hard or soft bias layer 304. The hard or soft bias layer 304 typically comprises a nonmagnetic seed layer such as Cr and a hard-magnetic biasing layer such as CoFe, CoPt, FePt, or CoPtCr for hard bias, or a soft-magnetic biasing layer such as NiFe, CoFe, NiFeMo, alloys of these compounds, or any combination thereof for soft bias. In one embodiment, the hard bias layer 304 comprises a Cr seed layer, a CoPt hard magnet, and a capping layer. The barrier layer 303 and the hard or soft bias layer 304 may be deposited by any method known in the art, such as ALD, CVD, or PVD. In one embodiment, the barrier layer 303 is deposited by CVD and the hard or soft bias layer 304 is deposited by PVD. Following the deposition of the hard or soft bias layer 304, the top of the sensor stack 231 may be planarized for further deposition. In one embodiment, a chemical mechanical polishing is used to planarize the top of the sensor stack 231.

Figure 7B:
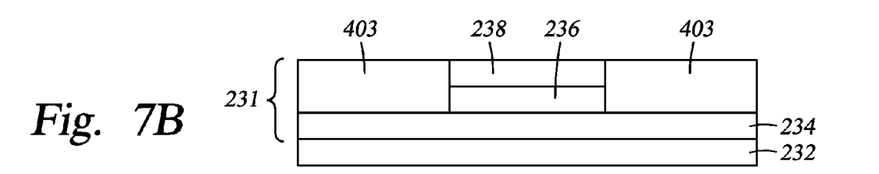
Figure 7C:
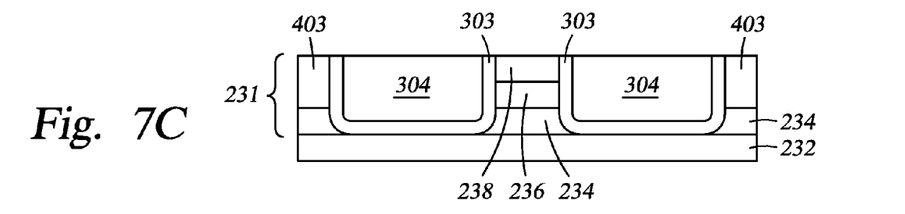
Figure 7D:
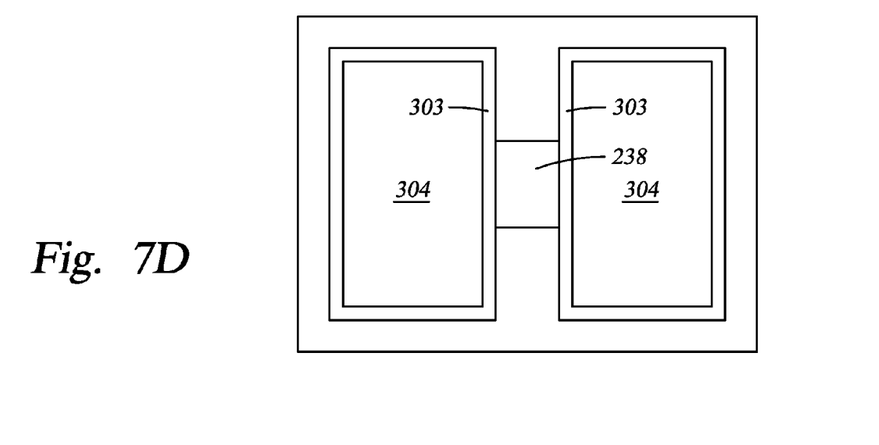

FIGS. 7B, 7C, and 7D depict the resulting structure. FIG. 7B is a cross sectional view of the sensor stack 231 along line y shown in FIG. 7A. Because the cross section along line y is protected by the mask 701, the layers in FIG. 7B are the same as in FIG. 6B. FIG. 7C is a cross sectional view of the sensor stack along line x shown in FIG. 7A. Portions of the pinned layer 234, the non-magnetic layer 236, the free layer 238, and the dielectric layer 403 not covered by the mask 701 have been removed. The barrier layer 303 is then deposited in the one or more channels formed as the result of the removal. The hard or soft bias layer 304 is then deposited over the barrier layer 303 in the channels. FIG. 7D is a top view of the resulting structure. Portions of the free layer 238 and the dielectric layer 403 are protected by the mask 701. The unprotected portions have been replaced with the barrier layer 303 and the hard or soft bias layer 304.

Figure 8A:
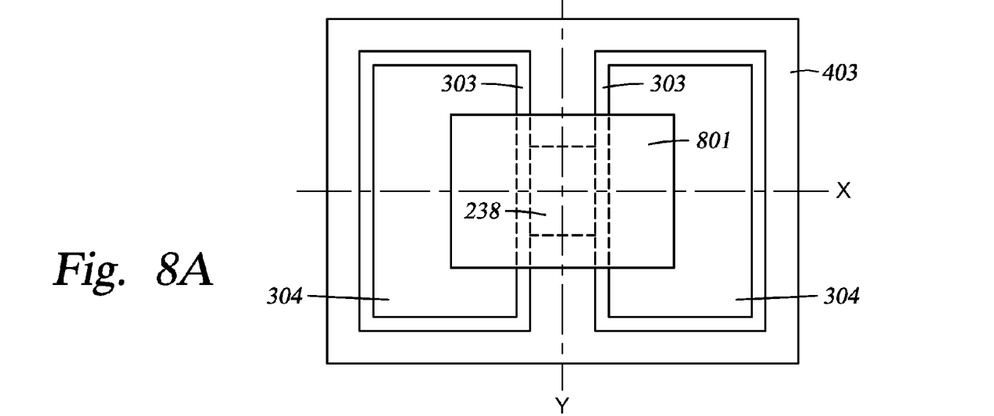
FIG. 8A-8D illustrate the process of defining the pinned layer stripe height according to various embodiments of the invention.

FIGS. 8A-8D illustrate the process steps of defining the pinned layer stripe height. FIG. 8A is a top view showing a mask 801 placed on the newly formed top of the sensor stack 231. The portion of the sensor stack covered by the mask 801 is illustrated with dotted lines. Portions of the sensor stack not protected by the mask 801 will be removed, and the void formed will be filled with one or more materials.

The mask 801 may be deposited and patterned by methods that are known in the art. In one embodiment, a mask layer is deposited on the sensor stack 231 by spin coating and patterned by photolithography. Photolithography is done by aligning a pre-patterned photomask on the mask layer and irradiating the mask layer with ultraviolent light. The pattern of the photomask is then transferred to the mask layer by removing the irradiated portions and thus, forming the mask 801. Next, portions of the sensor stack not covered by the mask 801 will be removed. Any method known in the art may be used to remove the portions. In one embodiment, the portions are removed by reactive ion etching, followed by ion milling. The mask 801 is then removed by any method known in the art. As the result of the reactive ion etching and ion milling, portions of the substrate 232 are exposed.

The exposed portions of the substrate 232 are to be covered with a second dielectric layer 503. The second dielectric layer 503 may or may not be the same material as the dielectric layer 403. The second dielectric layer 503 may comprise one or more materials such as $AlO_x$, $TaO_x$, $SiN_x$, $MgO_x$, or any combination thereof. Again the materials are chosen to realize a flat surface after the defining of the pinned layer stripe height. The deposition of the second dielectric layer 503 may be achieved by ALD, CVD, or PVD. In one embodiment, the dielectric layer 503 comprises MgO and is deposited by ALD. Following the deposition of the second dielectric layer 503, the top of the sensor stack 231 may be planarized for further deposition. In one embodiment, a chemical mechanical polishing is used to planarize the top of the sensor stack 231.

Figure 8B:
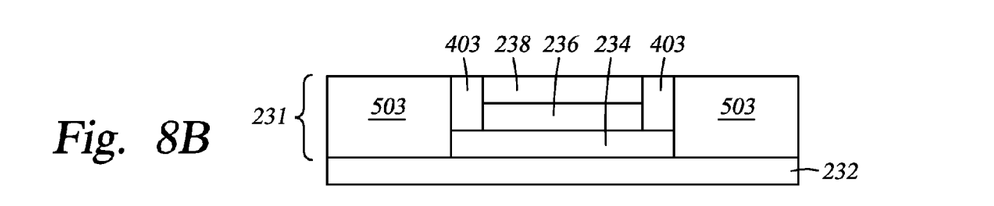
Figure 8C:
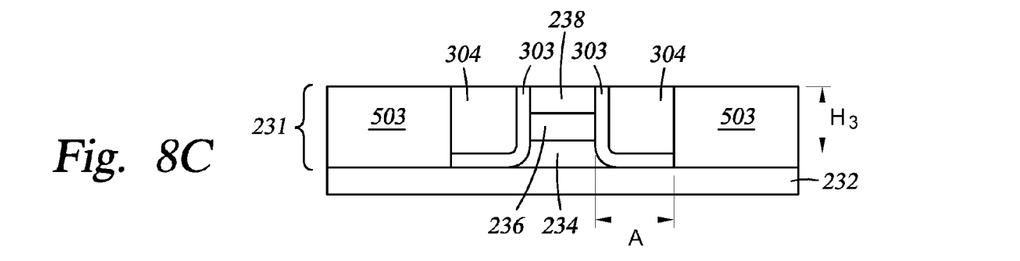
Figure 8D:
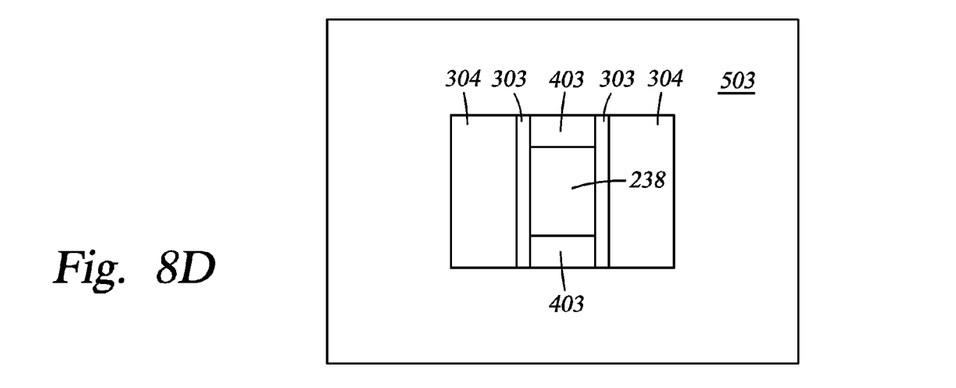

FIGS. 8B, 8C, and 8D depict the resulting structure. FIG. 8B is a cross sectional view of the sensor stack 231 along line y shown in FIG. 8A. Along line y, portions of the dielectric layer 403 and the pinned layer 234 not covered by the mask 501 have been removed and replaced with the second dielectric layer 503. As shown in FIG. 8B, the pinned layer 234 is defined so the pinned layer 234 extends past the backedge of the free layer 238. FIG. 8C is a cross sectional view of the sensor stack along line x shown in FIG. 8A. Along line x, portions of the pinned layer 234, the dielectric layer 403, the barrier layer 303, and the hard or soft bias layer 304 not covered by the mask 501 have been removed and replaced by the second dielectric layer 503. The hard or soft bias layer 304 is defined as illustrated by this figure. The hard or soft bias layer 304 has a width within the channels, represented by arrows "A". Along the width "A", the hard or soft bias layer 304 has a substantially uniform thickness within the channels, represented by arrows "H3". This uniform thickness may improve the stability of the SEP structure. In addition, the pinned layer 234 and the hard or soft bias layer 304 are defined in the same process step, as shown by FIGS. 8B and 8C.

FIG. 8D is a top view of the resulting structure. Portions not protected by the mask 501 have been removed and replaced with the second dielectric layer 503. Portions of the dielectric layer 403, the hard or soft bias layer 304, the barrier layer 303, and the free layer 238 protected by the mask 501 remain on top of the sensor stack.

In summary, by defining the free layer prior to defining the track width, the hard or soft bias layer may obtain a substantially uniform thickness in a SEP structure. The hard or soft bias layer and the pinned layer are defined in the same process step. The one or more channels within the sensor structure are fully filled with the hard or soft bias layer. This SEP structure further reduces potential instability issues.

While the foregoing is directed to embodiments of the present invention, other and further embodiments of the invention may be devised without departing from the basic scope thereof, and the scope thereof is determined by the claims that follow.

What is claimed is:

1. A magnetic head, comprising:
   a sensor stack formed over a substrate, the sensor stack having a pinned layer, a free layer and a non-magnetic layer sandwiched between the pinned layer and the free layer;
   a first hard or soft bias layer disposed within a first channel, positioned within the sensor stack and having a substantially uniform thickness, wherein the first channel is defined by a first barrier layer and bound by the free layer, the non-magnetic layer, the pinned layer and the substrate;
   a second hard or soft bias layer disposed within a second channel, positioned within the sensor stack and having a substantially uniform thickness, wherein the second channel is defined by a second barrier layer and bound by the free layer, the non-magnetic layer, the pinned layer and the substrate;
   a first dielectric layer bordered by and in contact with the first barrier layer, the pinned layer and the first hard or soft bias layer; and
   a second dielectric layer bordered by and in contact with the second barrier layer, the pinned layer and the second hard or soft bias layer.

2. The magnetic head of claim 1, wherein the non-magnetic layer comprises MgO for tunnel junction magnetoresistive (TMR) barrier or AgSn for current perpendicular to the plane (CPP) spacer.

3. The magnetic head of claim 2, wherein the first barrier layer is disposed within the first channel on the substrate, wherein the first hard or soft bias layer is disposed on the first barrier layer.

4. The magnetic head of claim 3, wherein the first barrier layer comprises SiN, TaOx, AlOx, or SiOxNy, the first hard bias layer comprises CoFe, CoPt, FePt, or CoPtCr, and the first soft bias layer comprises NiFe, CoFe, NiFeMo, alloys of these compounds, or any combination thereof.

5. The magnetic head of claim 4, wherein the second barrier layer is disposed within the second channel on the substrate, wherein the second hard or soft bias layer is disposed on the second barrier layer.

6. The magnetic head of claim 5, wherein the second barrier layer comprises SiN, TaOx, AlOx, or SiOxNy, the second hard bias layer comprises CoFe, CoPt, FePt, or CoPtCr, and the second soft bias layer comprises NiFe, CoFe, NiFeMo, alloys of these compounds, or any combination thereof.

* * * * *